United States Patent
Ohkawa et al.

(10) Patent No.: US 6,356,074 B1
(45) Date of Patent: Mar. 12, 2002

(54) MAGNETORESISTIVE DETECTOR WITH MULTIPLE BIAS MAGNETS FOR BIASING ITS MAGNETORESISTIVE ELEMENTS

(75) Inventors: Takuya Ohkawa; Rirou Senda, both of Kitakyushu (JP)

(73) Assignee: Kabushiki Kaisha Yaskawa Denki, Kitakyushu (JP)

(*) Notice: Subject to any disclaimer, the term of this patent is extended or adjusted under 35 U.S.C. 154(b) by 0 days.

(21) Appl. No.: 09/601,209
(22) PCT Filed: Jan. 4, 1999
(86) PCT No.: PCT/JP99/00003
§ 371 Date: Jul. 28, 2000
§ 102(e) Date: Jul. 28, 2000
(87) PCT Pub. No.: WO99/39157
PCT Pub. Date: Aug. 5, 1999

(30) Foreign Application Priority Data

Jan. 28, 1998 (JP) .......................... 10-032086

(51) Int. Cl.⁷ .......................... G01B 7/30; G01B 7/14; G01R 33/09; H01L 43/08
(52) U.S. Cl. .................. 324/207.21; 324/174; 324/252; 338/32 R
(58) Field of Search .......................... 324/117 R, 207.2, 324/207.21, 207.25, 235, 251, 252, 174; 338/32 R, 32 H; 341/15

(56) References Cited

U.S. PATENT DOCUMENTS

| | | | |
|---|---|---|---|
| 4,053,829 A | * 10/1977 | Maruo | ............... 324/252 X |
| 4,853,632 A | 8/1989 | Nagano et al. | |
| 5,545,986 A | 8/1996 | Ariyoshi et al. | ....... 324/207.21 |

FOREIGN PATENT DOCUMENTS

| | | | |
|---|---|---|---|
| JP | 1-225183 | * | 9/1989 |
| JP | 3-68882 | * | 3/1991 |
| JP | 4-108373 | | 9/1992 |
| JP | 4-309801 | | 11/1992 |
| JP | 4-369405 | | 12/1992 |
| JP | 8-204254 | * | 8/1996 |
| JP | 9-105603 | | 4/1997 |

* cited by examiner

Primary Examiner—Gerard R. Strecker
(74) Attorney, Agent, or Firm—Armstrong, Westerman & Hattori, LLP

(57) ABSTRACT

The magnetoresistive detector of the present invention uses magnetoresistive elements for detecting changes in the magnetic field of a moving magnet 3 which changes a magnetic field, wherein bias magnets (21, 22, 23, 24) can be mounted without using positioning jigs, errors in mounting are prevented, and the mounting density of components on a printed circuit board (4) is improved, whereby improved quality and compactness of the magnetoresistive detector can be achieved. For that purpose, the shape and dimensions of magnetoresistive detector elements (11, 12, 13, 14) are made identical to the shape and dimensions of the bias magnets (21, 22, 23, 24), and on the printed circuit board (4), positioning sections (41) for simultaneously positioning the magnetoresistive detector elements (11, 12, 13, 14) and bias magnets (21, 22, 23, 24) are provided.

2 Claims, 6 Drawing Sheets

4 PRINTED CIRCUIT BOARD

US 6,356,074 B1

MAGNETORESISTIVE DETECTOR WITH MULTIPLE BIAS MAGNETS FOR BIASING ITS MAGNETORESISTIVE ELEMENTS

TECHNICAL FIELD

The present invention relates to a structure for mounting magnetoresistive elements and bias magnets in a magnetoresistive detector, wherein the magnetoresistive elements are used.

BACKGROUND ART

A magnetoresistive detector according to the prior art is constructed by combining a detection mechanism portion as shown in FIG. 6 and detection circuits as shown in FIG. 8.

FIG. 6 shows a perspective view of the detection mechanism portion of the magnetoresistive detector, wherein two signals, which are rectangular wave signals each having one pulse per revolution and have a phase difference of 90°, can be obtained. Bias magnet 2 is fixed on the surface of printed circuit board 4 and on the reverse side of the printed circuit board 4, magnetoresistive elements 11, 12, 13, and 14 (indicated by the dotted lines) are fixed. A moving magnet 3 which changes a magnetic field has a detection mechanism which revolves opposite to the magnetoresistive elements 11, 12, 13, and 14.

FIG. 7 is a sectional view showing the positional relationship for mounting the respective components. 15 denotes lead portions of the magnetoresistive elements 11, 12, 13, and 14.

In FIG. 7, the magnet for changing magnetic field 3 and magnetoresistive elements 11, 12, 13, and 14 are faced with a predetermined gap therebetween, the lead portions 15 of the four magnetoresistive elements are fixed to the mountable components using the printed circuit board 4 by soldering. On the other-side surface across the printed circuit board 4, an annular bias magnet 2 is fixed. The annular bias magnet 2 is composed in that, by providing the magnetoresistive elements 11, 12, 13, and 14 with a necessary bias magnetic field, rectangular wave signals 72 and 73 each having one pulse per revolution can be obtained in the detection circuits shown in FIG. 8. Rectangular wave signals 72 and 73 each having one pulse electrically have a phase difference of 90° therebetween and detecting such phase difference enables detection of the revolving direction.

FIG. 8 is a view showing a circuit composition of detection circuits 7.

The changes in the magnetic field produced by revolution of the magnet for changing magnetic field 3 are detected by the four magnetoresistive elements 11, 12, 13, and 14 which are faced, and then, the rectangular wave signals 72 and 73 are obtained in the detection circuits 7. R denotes resistance and VR denotes variable resistance. 71 denotes operational amplifiers which serve to wave-shape signals of the magnetoresistive elements 11, 12, 13, and 14 into rectangular waves.

In FIG. 8, since the revolving directions can also be detected, two detection circuits 7 are used.

Voltage is impressed on both ends of the magnetoresistive elements, the vector sum of the changes in the magnetic field changed due to revolution of the magnet for changing a magnetic field 3 and changes in magnetism of the bias magnet 2 is detected by the magnetoresistive elements, the detected signal voltages generated at the middle point terminals B of the magnetoresistive elements are wave-shaped by the operational amplifiers 71, whereby the rectangular signals 72 and 73 are obtained.

Furthermore, the circuits are also constructed so that, for the purpose of eliminating effects of external noise, changes in voltage, and changes in temperature, the magnetoresistive element 11 and magnetoresistive element 13, and the magnetoresistive element 12 and magnetoresistive element 14 are combined, wherein electrical signals having a phase difference of 180° can be obtained, and the differential signals detected by the respective magnetoresistive elements are wave-shaped.

FIG. 9 is a view showing the detailed interior composition of one magnetoresistive element. (Reference numerals 11–14 and 11A–14A are omitted for clarity.)

The magnetoresistive elements 11, 12, 13, and 14 comprise magnetoresistive detector elements 11A, 12A, 13A, and 14A (shown below in FIG. 10) and lead portions 15 (shown in FIG. 7) of the magnetoresistive elements. In a magnetoresistive element main body, tip 10 composed of two comb-shaped magnetoresistive patterns is used and C1 indicates the center of the tip 10. A, B, and C denote terminal names of lead portions 15 and the detected signals are outputted from the terminals B.

FIG. 10 is a view showing a positional relationship between the magnetoresistive elements 11, 12, 13, and 14 and annular bias magnet 2.

The centers C1 of the tips 10 of the magnetoresistive detector elements 11A, 12B, 13A, and 14A and boundary portions between N pole and S pole of the annular bias magnet 2 are positioned so as to coincide with each other. The annular bias magnet 2 is fixed on the opposite-side surface across the printed circuit board 4 and on the circumference identical to the magnetoresistive elements 11, 12, 13, and 14.

FIG. 11 is a plan showing the magnetic polarity composition of N poles and S poles of the magnet for changing a magnetic field 3 used in the prior art. The magnetoresistive elements have properties to detect magnetic changes at the magnetic boundaries between N pole and S pole, and therefore, unless the bias magnets are used, rectangular signals each having two pulses are detected per revolution.

Herein, in order to obtain one pulse per revolution, the magnetic polarity composition of the magnet for changing a magnetic field 3 on the revolution side shown in FIG. 11 and magnetic composition of the bias magnets 2 on the fixing side are employed, and the vector sum of magnetic changes according to this combination is detected, and thus, the rectangular wave signals 72 and 73 each having one pulse can be obtained per revolution.

On the other hand, according to the prior art, when the annular bias magnet 2 is positioned and fixed on the opposite-side surface across the printed circuit board 4 and on the identical circumference in alignment with the centers C1 of the tips 10 of the magnetoresistive elements and fixed printed circuit board 4, because the annular bias magnet 2 has no positioning function in the circumferential direction, and in addition, the magnetic pole position of the annular bias magnet 2 cannot be visually recognized, it is necessary to mount the annular bias magnet 2 by using positioning jigs (not illustrated).

In addition, due to the annular bias magnet 2, the other components cannot be mounted on the identical circumference on the opposite-side surface, on which the magnetoresistive elements 11, 12, 13, and 14 are not arranged, of the printed circuit board 4, and therefore, mounting density of components is lowered, and resultantly, there are problems in that the dimensions of the outward form of the printed circuit board is increased and the magnetoresistive detector cannot be reduced in size.

DISCLOSURE OF THE INVENTION

Therefore, the present invention aims to provide a magnetoresistive detector, wherein the bias magnet 2 can be mounted without using positioning jigs, and besides, an error in mounting the bias magnets 2 can be prevented and mounting density of components on the printed circuit board is increased, and whereby, the detector is enhanced in quality and reduced in size.

In order to solve the above problems, according to the present invention, a magnetoresistive detector is comprised of a printed circuit board, magnetoresistive elements, bias magnets, a magnet for moving magnetic field, and detection circuits for wave-shaping the signals detected by the magnetoresistive elements, wherein said bias magnets have approximately the same dimensions of the magnetoresistive elements and are fixed so as to overlap the magnetoresistive elements, and on the printed circuit board, holes, having approximately the same dimensions of the magnetoresistive elements, for positioning and fixing the magnetoresistive elements are disposed.

Furthermore, two types of the bias magnets are provided, the outward form of the two types of bias magnets are different from each other, two types of outward form of the holes of the printed circuit board which are corresponded to the outward forms of the two types of bias magnets are provided, and marking lines for recognizing the boundaries of magnetic poles are provided on the surfaces of the bias magnets.

Moreover, said bias magnets are provided with mismounting prevention portions and are provided with marks for recognizing the boundaries of magnetic poles.

BEST MODE FOR CARRYING OUT THE INVENTION

Figure 8:
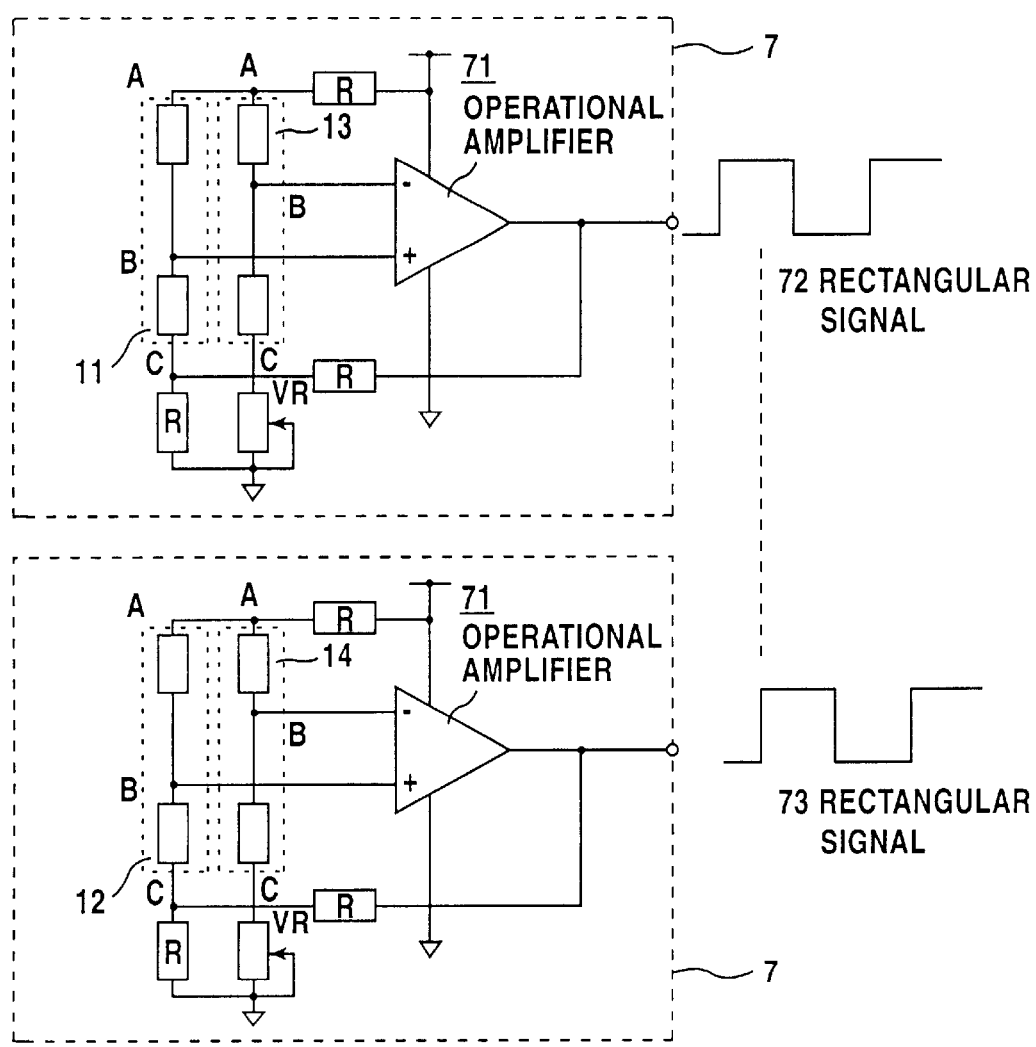
FIG. 8 is a view showing the detection circuit according to the prior art.
Figure 9:
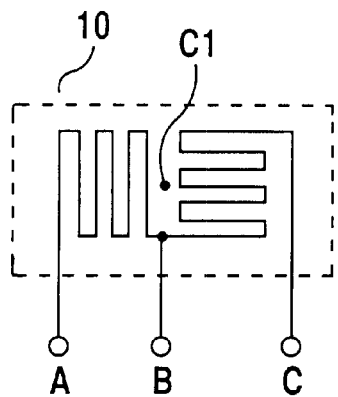
FIG. 9 is a view showing the detailed interior composition of a magnetoresistive elements according to the prior art.
Figure 10:
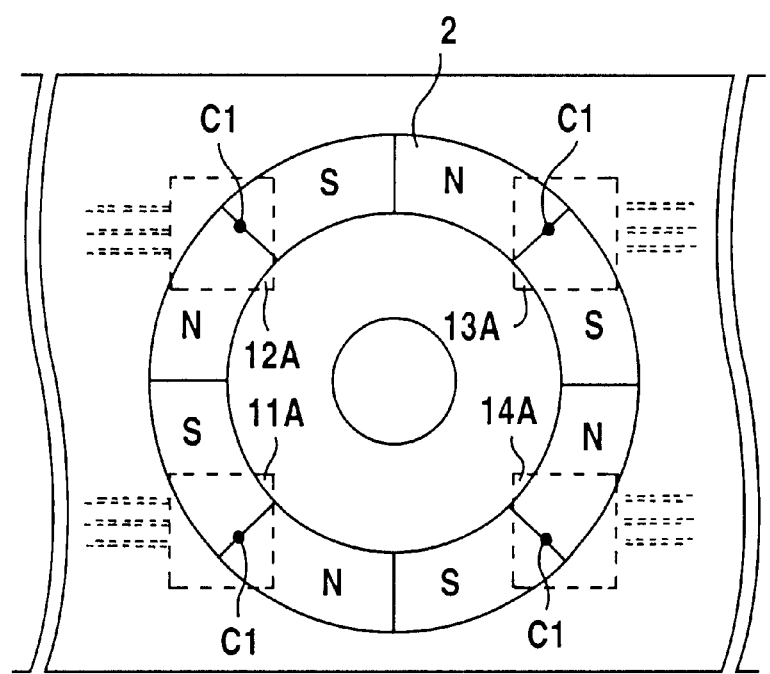
FIG. 10 is a view showing a mounted condition of the magnetoresistive elements and annular bias magnet according to the prior art.
Figure 11:
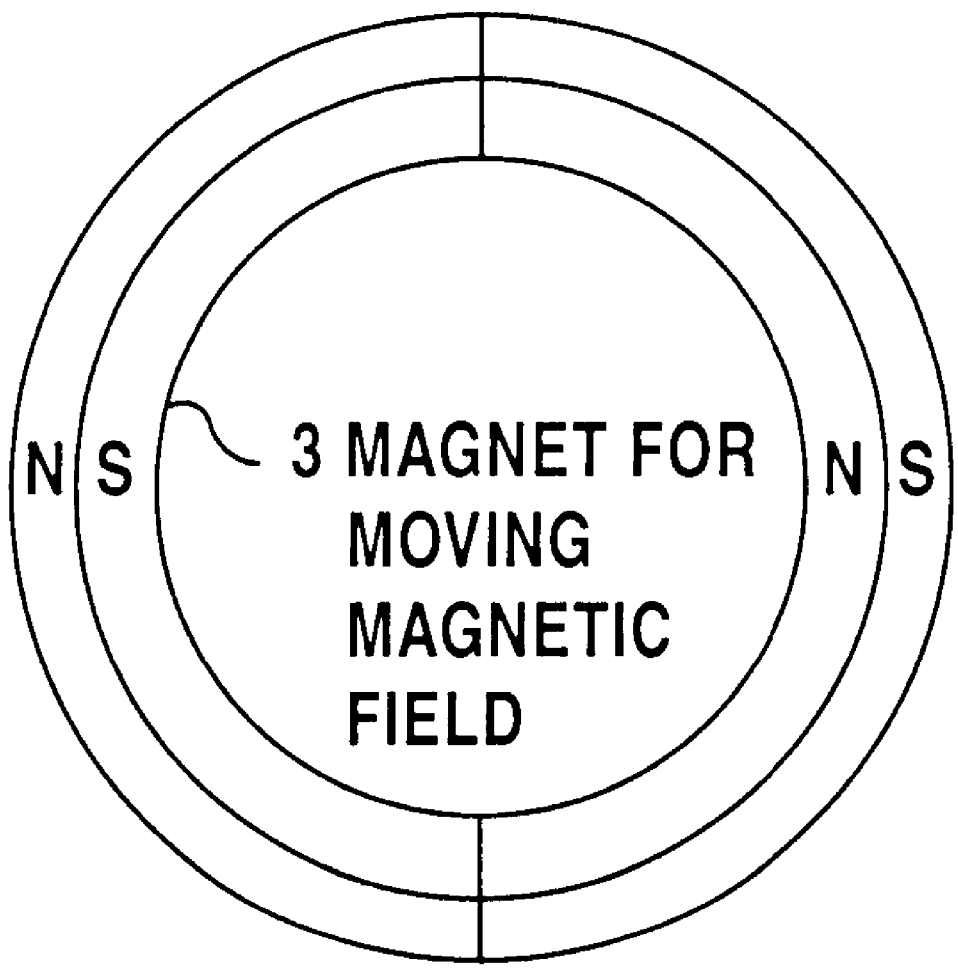
FIG. 11 is a view showing a shape and magnetized conditions of the magnet for changing a magnetic field according to the prior art.

Hereinafter, preferred embodiments of the present invention are described with reference to the drawings. A magnetoresistive detector according to the present embodiment comprises the detection mechanism portion of FIG. 1 and the same detection circuit of the prior art of the FIG. 8.

Figure 1:
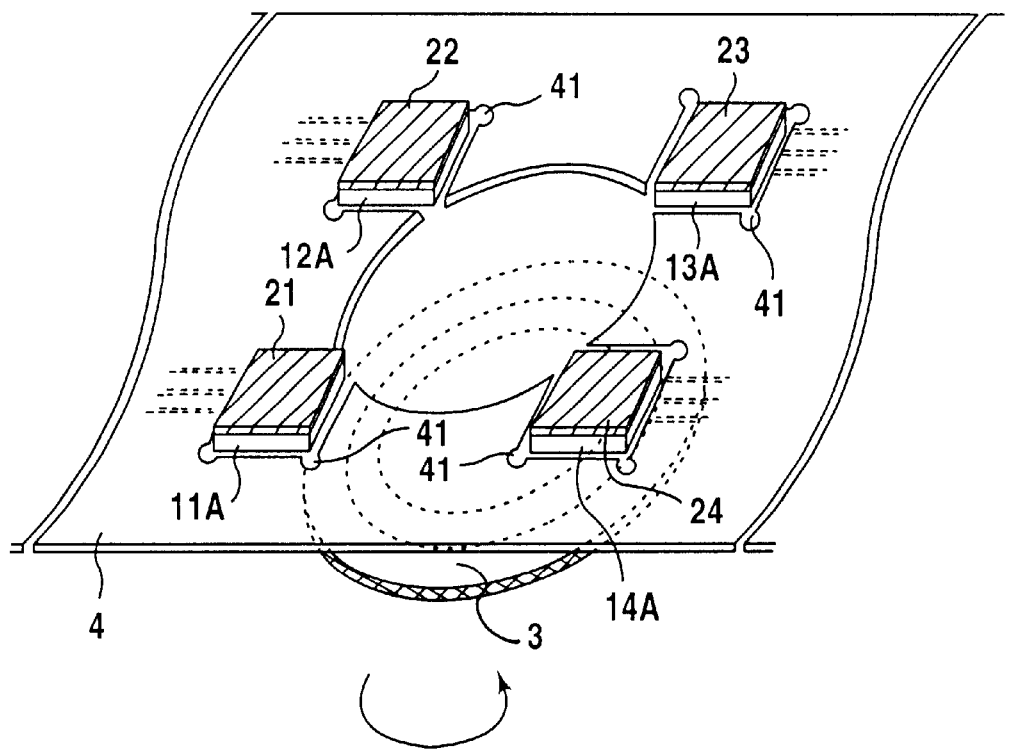
FIG. 1 is a perspective view of a detection mechanism portion of the magnetoresistive detector according to the invention.

FIG. 1 is a perspective view of a detection mechanism portion showing an embodiment of the mounted composition of the magnetoresistive element and bias magnets according to the invention.

The printed circuit board 4 is used for mountable components for mounting magnetoresistive elements 11, 12, 13, and 14.

It shows a condition where the prior art bias magnet 2 is divided and bias magnets 21, 22, 23, and 24 are fixed on the magnetoresistive detector elements 11A, 12A, 13A, and 14A, respectively.

Figure 2:
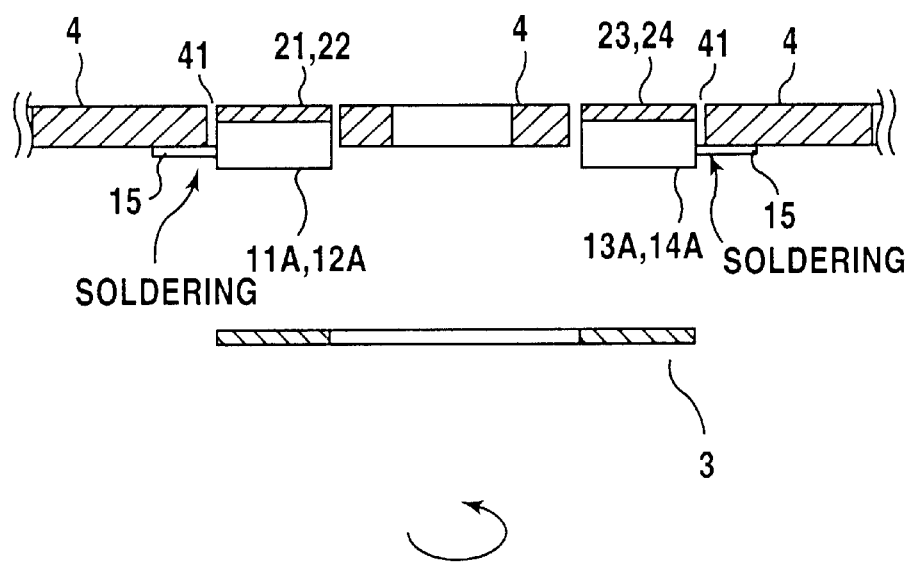
FIG. 2 is a sectional view showing the positional relationship of respective components of the detection portion according to the invention.

FIG. 2 is a sectional view showing the positional relationship of respective components according to an embodiment.

It is a view showing a condition where positioning sections 41 (hole portions made in the printed circuit board 4) for simultaneously mounting the detection portions 11A, 12A, 13A, and 14A and bias magnets 21, 22, 23, and 24 are disposed at four points and the magnetoresistive detector elements 11A, 12A, 13A, and 14A and bias magnets 21, 22, 23, and 24 are mounted.

The annular magnet 3 and magnetoresistive elements 11, 12, 13, and 14 face each other, the four magnetoresistive detector elements 11A, 12A, 13A, and 14A are inserted into the positioning sections 41 of the printed circuit board 4, and respective lead portions 15 of the magnetoresistive elements are fixed on the printed circuit board 4 by soldering.

The relationship between the magnetoresistive elements 11, 12, 13, and 14 and magnet for changing a magnetic field 3 and composition thereof are the same as those of the prior art. The shape and dimensions of the bias magnets 21, 22, 23, and 24 are identical to the shape and dimensions of the magnetoresistive detector elements 11A, 12A, 13A, and 14A.

The magnetoresistive detector elements 11A, 12A, 13A, and 14A are inserted into the positioning sections 41 of the printed circuit board 4, respective lead portions 15 of the magnetoresistive element are fixed by soldering, and thereafter, on the rear surfaces of the magnetoresistive detector elements 11A, 12A, 13A, and 14A, glue is applied, and the bias magnets 21, 22, 23, and 24 are glued to be fixed by utilizing the positioning sections 41, and thus, mounting of the bias magnets is completed.

The bias magnets 21, 22, 23, and 24 are magnetized in advance so that the magnetic pole boundary lines between N pole and S pole of the bias magnets 21, 22, 23, and 24 coincide with the middle point portions of C1 of the magnetoresistive elements 11, 12, 13, and 14, respectively. (The "magnetic pole boundary line" refers to a line between the N and S poles in which any point on the line is magnetically neutral. That is, on the line, there is no net N or S magnetic force.) Using this configuration, by mechanical positioning only, the magnetoresistive elements 11, 12, 13, and 14 can be provided with the appropriate bias magnetic field.

The dimensions of the positioning sections 41 are almost identical to the shape and dimensions of the magnetoresistive detector elements 11A, 12A, 13A, and 14A and bias magnets 21, 22, 23, and 24 and the dimensions are employed so that the magnetoresistive detector elements 11A, 12A, 13A, and 14A, and bias magnets 21, 22, 23, and 24 can be smoothly inserted.

The dimensions of the bias magnets 21, 22, 23, and 24 and magnetoresistive detector elements 11A, 12A, 13A, and 14A are made identical, and as a result, the annular bias magnet 2 is omitted and the mountable components can be efficiently mounted on the printed circuit board 4.

Figure 3:
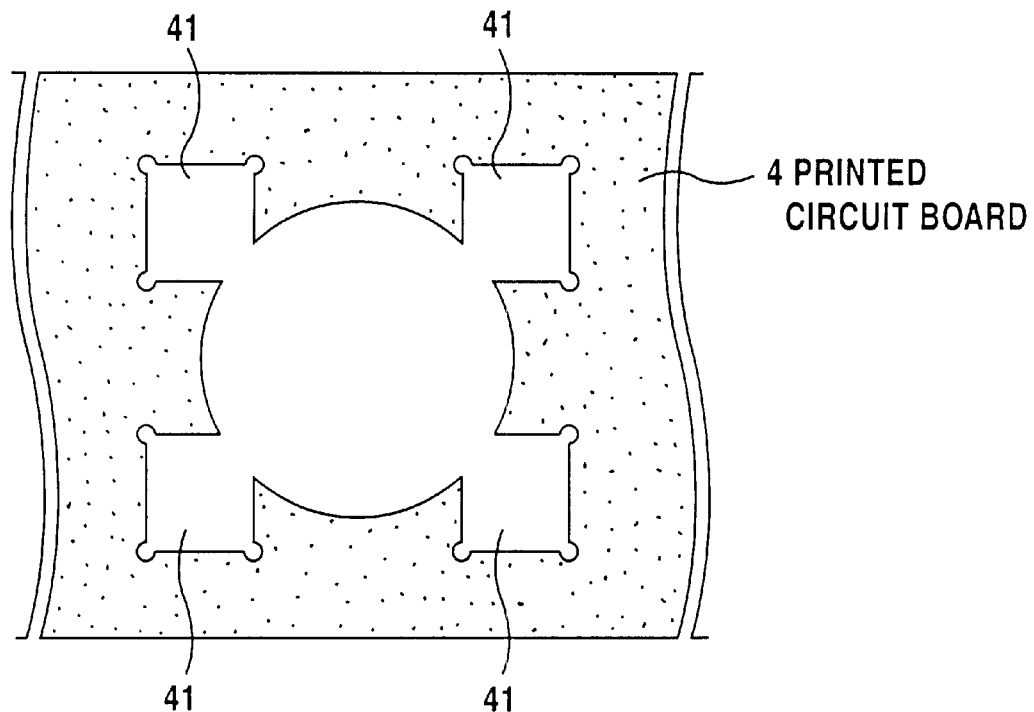
FIG. 3 is a view showing the detailed shape of positioning sections disposed on the printed circuit board according to the present invention.

FIG. 3 is a view showing the detailed shape of the positioning sections 41 of the printed circuit board 4 used in the embodiment. The positioning sections 41 provided on the printed circuit board 4 are used as positioning components for the magnetoresistive detector elements 11A, 12A, 13A, and 14A and bias magnets 21, 22, 23, and 24.

Figure 4:
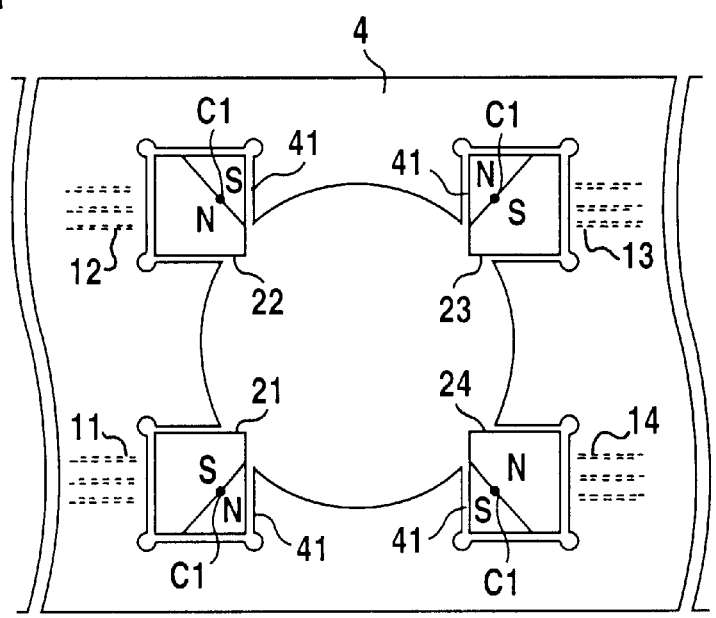
FIG. 4 is a view showing an mounted condition of the magnetoresistive elements and bias magnets according to the present invention.

FIG. 4 is a view showing the relationship of attachment between the magnetoresistive elements 11, 12, 13, and 14 and bias magnets 21, 22, 23, and 24 according to the present embodiment.

The magnetic pole boundary lines between N pole and S pole of the bias magnets 21, 22, 23, and 24 are arranged so as to coincide with the middle point portions of C1 of the magnetoresistive elements 11, 12, 13, and 14 (only the lead portions are illustrated by the dotted lines).

Figure 5:
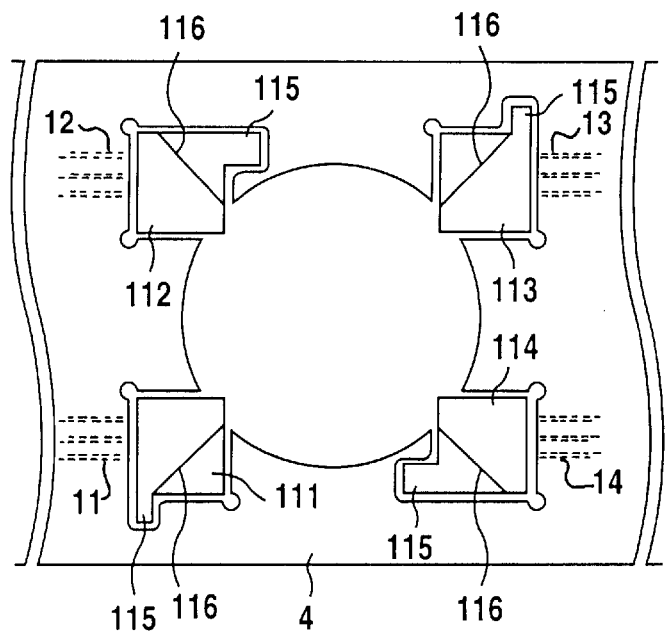
FIG. 5 is a view showing an mounted condition of the magnetoresistive elements and bias magnets according to another embodiment.
Figure 6:
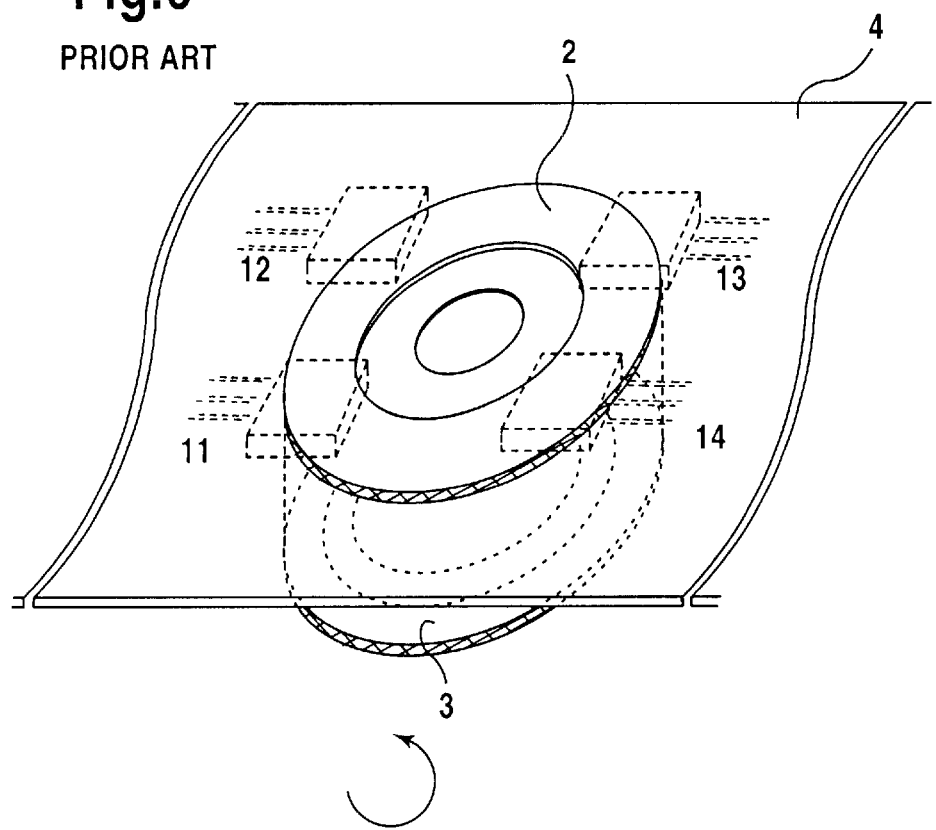
FIG. 6 is a perspective view of a detection mechanism portion of the magnetoresistive detector according to the prior art.
Figure 7:
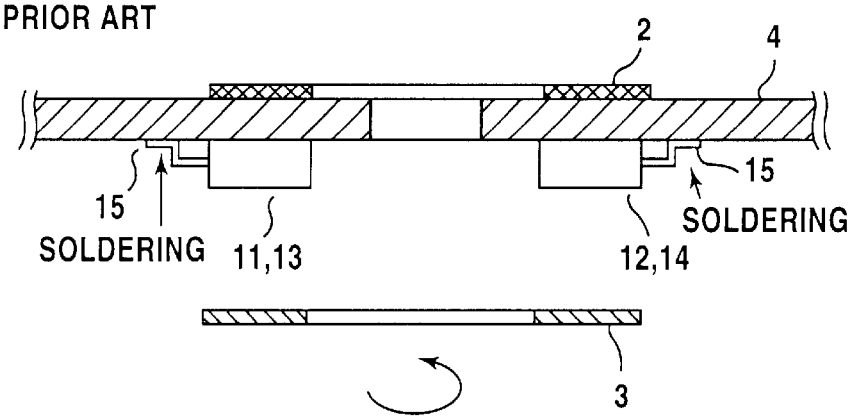
FIG. 7 is a sectional view showing the positional relationship of respective components of the detection portion according to the prior art.

FIG. 5 shows another embodiment. It shows an example where convex portions 115 are provided at a part of respective bias magnets 21, 22, 23, and 24, respectively, whereby the outward form is modified when the magnets for bias magnetic field 21, 22, 23, and 24 are stuck on the magnetoresistive elements 11, 12, 13, and 14.

As shown in FIG. 4, two types of the bias magnets 21 and 23 and bias magnets 22 and 24 are necessary for the magnetized conditions of the bias magnets. (The term "type" of magnet refers to the relative positioning of the magnetic pole boundary lines between the N and S poles.)

In a case where the outward forms of the bias magnets 21, 22, 23, and 24 are rectangular and which are mounted on the magnetoresistive elements 11, 12, 13, and 14, since the magnetized conditions cannot be visually distinguished, there is a possibility of committing an error in mounting.

Therefore, by modifying the outward form, i.e., the shapes of their perimeters, such as in the bias magnets 111, 112, 113, and 114 of FIG. 5, an error in mounting is prevented, and besides, by making marks with marking lines 1 16 at the boundaries between N pole and S pole of the magnetic poles on one-side surface of the magnets, identifying the proper magnet becomes easier, whereby the magnets 111, 112, 113, and 114 can be securely mounted.

As has been described above, according to the present invention, on the mountable components for mounting the magnetoresistive elements, the positioning sections for simultaneously positioning the magnetoresistive elements and bias magnets are disposed, and whereby, the conventional mounting using positioning jigs becomes unnecessary, thus resulting in reduced mounting time.

Also, other components can be mounted on the printed circuit board portion where mounting was priorly impossible due to the annular bias magnet, and mounting density of components on the printed circuit board is improved, and resultantly, such effects are produced in that the dimensions of the outward form of the printed circuit board are reduced and the detector can be reduced in size.

Also, by setting the shape and dimensions of the bias magnets to be the same shape and dimensions as the magnetoresistive elements, the bias magnets can also be made more compact and the bias magnets can be reduced in cost.

Furthermore, mis-mounting prevention portions such as convex portions are provided at a part of respective bias magnets and the bias magnets are fixed by making marks indicating the boundaries between N poles and S poles of the magnetic poles on one-side surface of the bias magnets, whereby such effects are produced in that, an error in mounting the bias magnets can be prevented and quality is enhanced.

Heretofore, a rotary-type magnetoresistive detector has been described, however, the structure wherein the magnetoresistive elements and bias magnets are simultaneously positioned is not limited to the rotary-type magnetoresistive detector, and thus, it is needless to describe that such a structure can be applied to a linear-type magnetoresistive detector as well.

INDUSTRIAL APPLICABILITY

The present invention is useful as a magnetoresistive detector using magnetoresistive elements, especially, as a structure capable of easily and accurately mounting magnetoresistive elements and bias magnets of the magnetoresistive detector.

What is claimed is:

1. A magnetoresistive detector comprising a printed circuit board, magnetoresistive elements, bias magnets, a magnet for changing a magnetic field, detection circuits for wave-shaping signals detected by the magnetoresistive elements, wherein said bias magnets have approximately the same dimensions as the magnetoresistive elements and are fixed so as to overlap the magnetoresistive elements, and on the printed circuit board, holes, having approximately the same dimensions of the magnetoresistive elements, for positioning and fixing the magnetoresistive elements are disposed.

2. The magnetoresistive detector as set forth in claim 1, wherein two types of the bias magnets are provided, the outward form of the two types of bias magnets are different from each other, two types of outward forms of the holes of the printed circuit board which are corresponded to the outward form of the two types of bias magnets are provided, and marking lines for recognizing the boundaries of magnetic poles are provided on the surfaces of the bias magnets.

* * * * *